US012272759B2

(12) United States Patent
Jin et al.

(10) Patent No.: US 12,272,759 B2
(45) Date of Patent: Apr. 8, 2025

(54) PHOTOVOLTAIC MODULE

(71) Applicants: JINKO SOLAR (HAINING) CO., LTD., Jiaxing (CN); ZHEJIANG JINKO SOLAR CO., LTD., Zhejiang (CN)

(72) Inventors: Hao Jin, Jiaxing (CN); Shiliang Huang, Jiaxing (CN); Zhiqiu Guo, Jiaxing (CN); Yingli Guan, Jiaxing (CN); Jingguo Yang, Jiaxing (CN)

(73) Assignees: JINKO SOLAR (HAINING) CO., LTD., Zhejiang (CN); ZHEJIANG JINKO SOLAR CO., LTD., Zhejiang (CN)

(*) Notice: Subject to any disclaimer, the term of this patent is extended or adjusted under 35 U.S.C. 154(b) by 386 days.

(21) Appl. No.: 17/950,078

(22) Filed: Sep. 21, 2022

(65) Prior Publication Data

US 2023/0387341 A1 Nov. 30, 2023

(30) Foreign Application Priority Data

May 31, 2022 (CN) .......................... 202210615452.5
Aug. 16, 2022 (CN) .......................... 202210983460.5

(51) Int. Cl.
*H01L 31/05* (2014.01)
*H01L 31/02* (2006.01)
(Continued)

(52) U.S. Cl.
CPC ...... *H01L 31/0508* (2013.01); *H01L 31/0201* (2013.01); *H01L 31/048* (2013.01); *H02S 40/34* (2014.12)

(58) Field of Classification Search
CPC ............... H01L 31/0201; H01L 31/048; H01L 31/0504; H01L 31/0508; H02S 40/34
See application file for complete search history.

(56) References Cited

U.S. PATENT DOCUMENTS

2007/0227580 A1* 10/2007 Nakajima ............... H01L 31/05
136/244
2011/0284052 A1  11/2011 Croft et al.
2013/0263909 A1  10/2013 Ogasahara et al.

FOREIGN PATENT DOCUMENTS

CN      206452364 U      8/2017
CN      209843729 U     12/2019
(Continued)

OTHER PUBLICATIONS

Machine translation of CN-210926041-U, Dong et al. (Year: 2020).*
(Continued)

*Primary Examiner* — Mayla Gonzalez Ramos
(74) *Attorney, Agent, or Firm* — USCH Law, PC

(57) ABSTRACT

The photovoltaic module includes at least one cell unit group, where the cell unit group includes multiple cell strings, and adjacent cell strings are connected by a connection structure. The connection structure includes a lead-out structure, which includes a main body portion, a first connecting portion and a second connecting portion that are arranged on the main body portion; the first connecting portion is connected to the second connecting portion, the first connecting portion is disposed in parallel to a length direction of the main body portion, and the second connecting portion extends out of the first connecting portion. In the length direction of the main body portion, the main body portion has a first edge, the second connecting portion is closer to the first edge relative to the first connecting portion, and a distance between the second connecting portion and the first edge ranges from 2 mm to 20 mm.

20 Claims, 14 Drawing Sheets

(51) Int. Cl.
*H01L 31/048* (2014.01)
*H02S 40/34* (2014.01)

(56) References Cited

FOREIGN PATENT DOCUMENTS

| | | | | | |
|---|---|---|---|---|---|
| CN | 210926041 | U | * | 7/2020 | ......... H01L 31/0504 |
| CN | 211828801 | U | * | 10/2020 | |
| CN | 112234120 | A | | 1/2021 | |
| CN | 112542528 | A | | 3/2021 | |
| CN | 212874507 | U | | 4/2021 | |
| CN | 213460373 | U | | 6/2021 | |
| CN | 113113514 | A | | 7/2021 | |
| CN | 214313221 | U | | 9/2021 | |
| CN | 215771175 | U | | 2/2022 | |
| CN | 216488084 | U | | 5/2022 | |
| JP | 2007235113 | A | | 9/2007 | |
| JP | 2012074750 | A | | 4/2012 | |
| JP | 2012142637 | A | | 7/2012 | |
| JP | 2014022702 | A | | 2/2014 | |
| JP | 2015023610 | A | | 2/2015 | |
| JP | 2019519942 | A | | 7/2019 | |
| JP | 2021170930 | A | | 10/2021 | |
| WO | 2011086878 | A1 | | 7/2011 | |
| WO | 2014068740 | A1 | | 5/2014 | |

OTHER PUBLICATIONS

Machine translation of CN-211828801-U, Dong et al. (Year: 2020).*
Jinko Solar (Haining) Co., Ltd., et al., Notice of Reasons for Refusal with English translation, JP 2023210686, Mar. 12, 2024, 12 pgs.
Jinko Solar (Haining) Co., Ltd. et al., Extended European Search Report, EP 22196722.7, May 19, 2023, 4 pgs.
Jinko Solar (Haining) Co., Ltd., et al., AU First Office Action, AU 2022235523, Aug. 18, 2023, 8 pgs.

* cited by examiner

PHOTOVOLTAIC MODULE

CROSS-REFERENCE TO RELATED APPLICATION

The present disclosure claims the benefit of priority under the Paris Convention to Chinese Patent Application No. 202210615452.5 filed on May 31, 2022 and Chinese Patent Application No. 202210983460.5 filed on Aug. 16, 2022, each of which is incorporated herein by reference in its entirety.

TECHNICAL FIELD

Embodiments of the present disclosure relate to photovoltaic technologies, and in particular to a photovoltaic module.

BACKGROUND

Solar energy is a clean, environmentally friendly, and renewable new energy. It has the advantages of sufficient resources, safety, cleanliness, wide distribution, and reliable technology, and has great developmental prospects. With the development and disclosure of new photovoltaic module technologies, the power generation efficiency and reliability of photovoltaic systems are effectively improved, and the cost of electricity is reduced. The photovoltaic industry requires cell modules with continuously improved performance and reduced costs, so as to drive maturity of new technologies of the cell modules, such as the one described in the present disclosure.

A photovoltaic module is generally made of multiple cell strings connected in series and/or in parallel, a frame, a glass panel, a back plate and sealing material that are encapsulated and vacuum sealed. The multiple cell strings are connected in series and/or parallel by bus bars, and are connected to a junction box by lead wires, so as to connect the power generated by a solar cell to an external circuit, thereby conducting the current generated by the photovoltaic module.

SUMMARY

An object of embodiments of the present disclosure is to provide a photovoltaic module, so as to avoid a risk of short circuit between cell strings caused by insufficient distance between two lead wires respectively connected to two ends of a diode.

In order to solve the above issue, a photovoltaic module is provided according to an embodiment of the present disclosure, and the photovoltaic module includes: at least one cell unit group, where the at least one cell unit group includes multiple cell strings connected in series and/or in parallel, and adjacent cell strings in the plurality of cell strings are connected by a connection structure. The connection structure includes a lead-out structure, the lead-out structure includes a main body portion, a first connecting portion arranged on the main body portion and a second connecting portion arranged on the main body portion, the first connecting portion is disposed parallel to a length direction of the main body portion, and the second connecting portion is connected to the first connection portion and extends away from the first connecting portion. The main body portion has a first edge in the length direction of the main body portion, the second connecting portion is closer to the first edge relative to the first connecting portion, and a distance between the second connecting portion and the first edge ranges from 2 mm to 20 mm.

In some embodiments, the first connecting portion covers part of the main body portion, and an orthographic projection of the first connecting portion on the main body portion has an overlapping area with the main body portion.

In some embodiments, the overlapping area coincides with the orthographic projection of the first connecting portion on the main body portion.

In some embodiments, one end of the first connecting portion closer to the first edge relative to the other end of the first connecting portion is connected to the second connecting portion.

In some embodiments, in a direction perpendicular to the length direction of the main body portion, the main body portion is provided with a first bending line and a second bending line, the first bending line is located at a junction of the main body portion and the first connecting portion, and the second bending line is located at a junction of the first connecting portion and the second connecting portion. In a thickness direction of the main body portion, the first bending line is disposed directly opposite to the first edge, and the second bending line is disposed directly opposite to an edge of the first connecting portion facing away from the first edge.

In some embodiments, in the length direction of the main body portion, the main body portion includes a first main body portion and a second main body portion. In a thickness direction of the main body portion, the first main body portion is disposed opposite to the first connecting portion, the first main body portion and the second main body portion together form the main body portion. In the thickness direction of the main body portion, a thickness of the first main body portion is less than or equal to a thickness of the second main body portion.

In some embodiments, the first main body portion is fixedly connected to the first connecting portion in a back-to-back manner.

In some embodiments, in the thickness direction of the main body portion, a thickness of the first connecting portion is less than or equal to the thickness of the first main body portion, or the thickness of the first connecting portion is less than or equal to the thickness of the second body portion.

In some embodiments, a length of the first connecting portion is less than or equal to a height of a part of the second connecting portion that extends out of the main body portion.

In some embodiments, a ratio of the length of the first connecting portion to the height of the part of the second connecting portion that extends out of the main body portion ranges from 0.4 to 1.

In some embodiments, the first connecting portion and the second connecting portion are integrally formed; the first connecting portion and the second connecting portion are fixedly connected to the main body portion.

In some embodiments, in a width direction of the main body portion, a width of the second main body portion is smaller than or equal to a width of the first main body portion.

In some embodiments, on a cross section in the thickness direction of the main body portion, the first main body portion has a cross-sectional area of the same area as a cross-sectional area of the second main body portion.

In some embodiments, each of the multiple of cell strings includes multiple solar cell pieces connected in series, and a busbar is provided on the multiple solar cell pieces. The cell unit group includes a first cell unit and a second cell unit disposed in sequence along a first direction, the first direction is an extending direction of the busbar, and the extending direction of the busbar is perpendicular to the length direction of the main body portion. The lead-out structure is disposed between the first cell unit and the second cell unit, and cell strings of the first cell unit and cell strings of the second cell unit are all connected to the main body, or the cell strings of the first cell unit and the cell strings of the second cell unit are all connected to the first connecting portion.

In some embodiments, a diode is further provided between the first cell unit and the second cell unit, and a positive electrode or a negative electrode of the diode is connected to the second connecting portion.

In some embodiments, both of the first cell unit and the second cell unit are connected to the main body portion or the first connecting portion by a solder strip. An extending direction of the solder strip intersects with the length direction of the main body portion. An end of the solder strip that comes out of the cell unit group is connected to the main body portion, or the first connecting portion.

In some embodiments, the above photovoltaic module also includes: a cover plate configured to cover an upper surface of the multiple cell strings, a back plate configured to cover a back surface of the multiple cell strings, a junction box, where a diode is disposed in the junction box, and the diode is connected to the second connecting portion, and an adhesive layer provided between the multiple cell strings and the cover plate and between the multiple cell strings and the back plate.

DETAILED DESCRIPTION

It is known from the background art that cell strings are connected in series and/or in parallel by bus bars, and are connected to diodes in a junction box by lead wires. In response to the distance between the lead wires at two ends of the junction box being insufficient, it is easy to cause the risk of short circuit between the cell strings. Therefore, the design of the distance between the lead wires at two ends of the junction box is particularly important.

Figure 1:
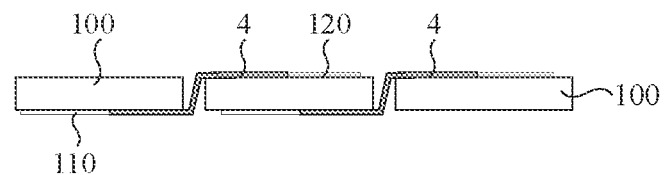
FIG. 1 is a schematic connection view of solar cell pieces of a photovoltaic module.

In a production process of a photovoltaic module, multiple solar cell pieces are generally connected in series by solder strips to form a cell string. For a conventional photovoltaic module, in some embodiments, a positive main grid and a negative main grid of a solar cell piece may be arranged on an upper surface and a back surface of the solar cell piece, respectively, that is, the positive main grid is located on the upper surface of the solar cell piece, and the negative main grid is located on the back surface of the solar cell piece. In other embodiments, the positive main grid may also be located on the back surface of the solar cell piece, and the negative main grid is located on the upper surface of the solar cell piece. The upper surface generally refers to a surface that directly receives sunlight, and the back surface generally refers to another surface opposite to the upper surface. As an example, as shown in FIG. 1, a positive main grid 110 and a negative main grid 120 of a solar cell piece 100 are respectively located on a back surface and an upper surface of the solar cell piece 100, and adjacent solar cell pieces 100 are connected to each other by a solder strip 4. For example, one end of the solder strip 4 is welded to the negative main grid 120 on the upper surface of the solar cell piece 100, and the other end of the solder strip 4 is welded to the positive main grid 110 on the back surface of another solar cell piece 100 adjacent to the solar cell piece 100, so as to connect adjacent solar cell pieces 100 in series.

Figure 2:
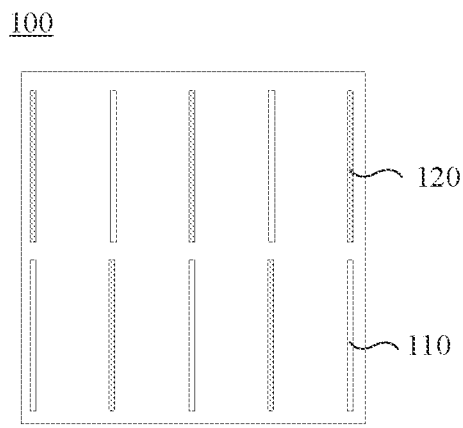
FIG. 2 is a schematic structural view of a back surface of a back-contact solar cell piece.
Figure 3:
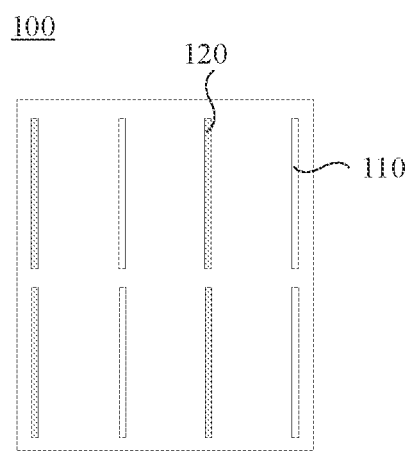
FIG. 3 is a schematic structural view of a back surface of another back-contact solar cell piece.

However, for a back-contact photovoltaic module, a positive main grid and a negative main grid of the solar cell piece 100 are both arranged on the back surface of the solar cell piece 100, as shown in FIG. 2 and FIG. 3. As an example, FIG. 2 and FIG. 3 show two graphic designs of a back surface of the back-contact photovoltaic module. The number of main grids on the back surface of the solar cell piece 100 may be an odd number or an even number. The number of main grids on the back surface of the solar cell piece 100 shown in FIG. 2 is an odd number, where the number of the positive main grids 110 and the number of the negative main grids 120 are not equal. The number of main grids on the back surface of the solar cell piece 100 shown in FIG. 3 is an even number, where the number of the positive main grids 110 and the number of the negative main grids 120 are equal.

Figure 4:
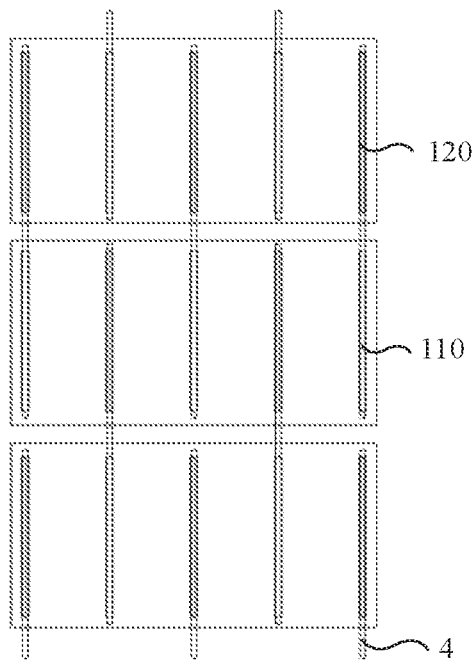
FIG. 4 is a schematic connection view of a back-contact solar cell piece.
Figure 5:
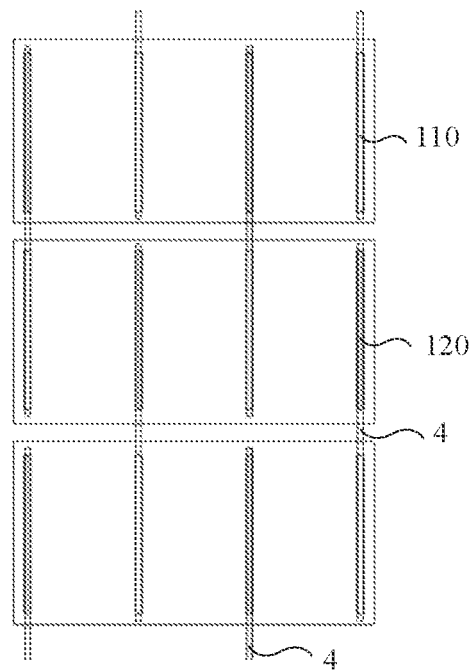
FIG. 5 is a schematic connection view of another back-contact solar cell piece.
Figure 6:
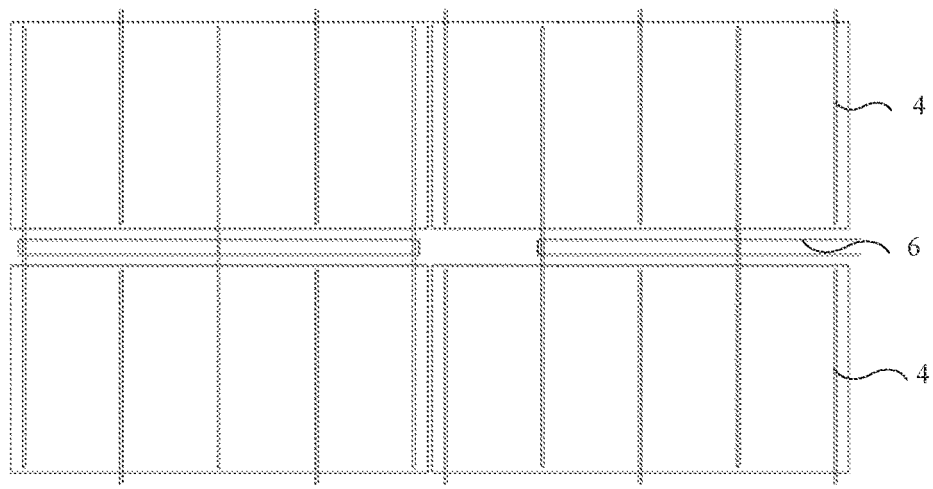
FIG. 6 is a schematic connection view of yet another back-contact solar cell piece.
Figure 7:
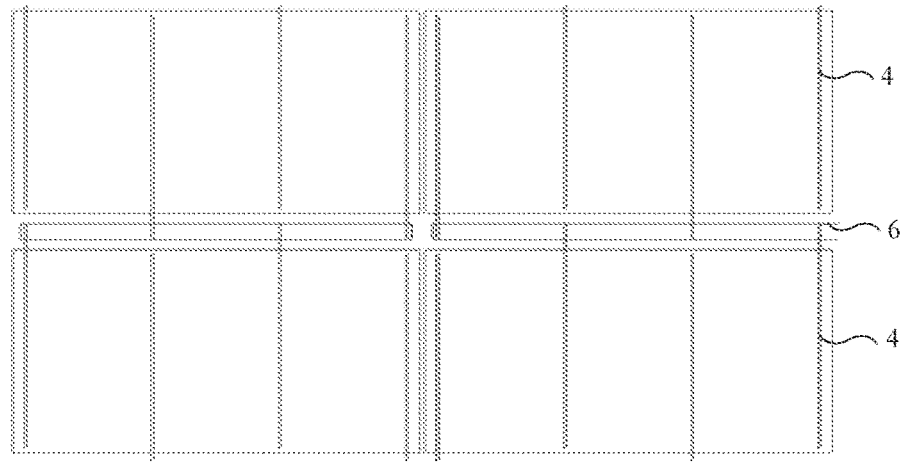
FIG. 7 is a schematic connection view of yet another back-contact solar cell piece.

In some embodiments, layout design of the photovoltaic module is generally performed by arranging the solar cell pieces 100 with small distance or negative distance, and the solar cell pieces 100 can be electrically connected in the form of a whole piece or multiple pieces to form multiple cell strings 10. Multiple cell strings 10 are electrically connected in series and/or in parallel. Since the positive main grids 110 and the negative main grids 120 of the back-contact solar cell are alternately arranged, as shown in FIG. 4 and FIG. 5, at an end of the cell string 10, the solder strip 4 may be located at an edge of the solar cell piece 100. As shown in FIG. 6 and FIG. 7, a first bus bar 6 of at least one cell string 10 of adjacent cell strings 10 in a parallel connection area needs to penetrate all the main grids, and the electrical energy generated by the photovoltaic module is drawn out by a lead-out portion located at an end by the first bus bar 6, and the lead-out portion is generally realized by bending the first bus bar 6. Since the solder strip 4 may be located at an edge of the solar cell piece 100 in the cell string 10, a distance between the lead-out portion and the solder strip 4 is insufficient, which will lead to the formation of overlap or the gap between adjacent lead-out portions being too insufficient. With the continuous optimization of the solar cell, the number of subsequent main grids may further increase, and the distance between the lead-out portions will be further reduced, especially for the back-contact photovoltaic module, which seriously affects the preparation of the photovoltaic module.

Figure 8:
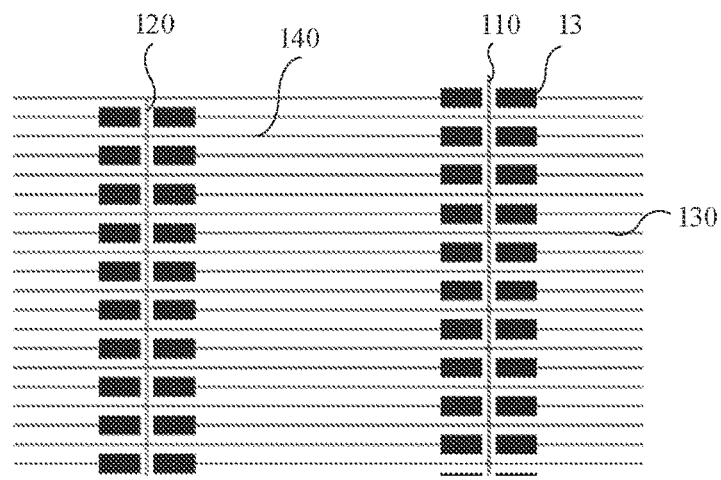
FIG. 8 is a schematic structural view of a back-contact solar cell piece after insulation printing is performed.

It should be noted that, for the back-contact photovoltaic module, except for the number of positive main grids 110 and the number of negative main grids 120 being different, except for the number of main grid lines being different, the polarities of symmetrical main grid lines on the upper and lower sides of a cutting line may be the same, or different. In addition, in a direction perpendicular to the main grid lines, there are also fine grids, and the fine grids are not in contact with the main grids of different polarities. Referring to FIG. 8, which shows a schematic structural view of a back-contact solar cell piece after insulation printing is performed. The back surface of the back-contact solar cell faces upward and is subjected to the insulation printing, and the back-contact photovoltaic module after insulation printing includes the positive main grid 110, the negative main grid 120, a positive electrode fine grid 130, a negative electrode fine grid 140, and an insulating glue 13, where a printing height of the insulating glue 13 is greater than or equal to twice of a height of the fine grid.

Figure 9:
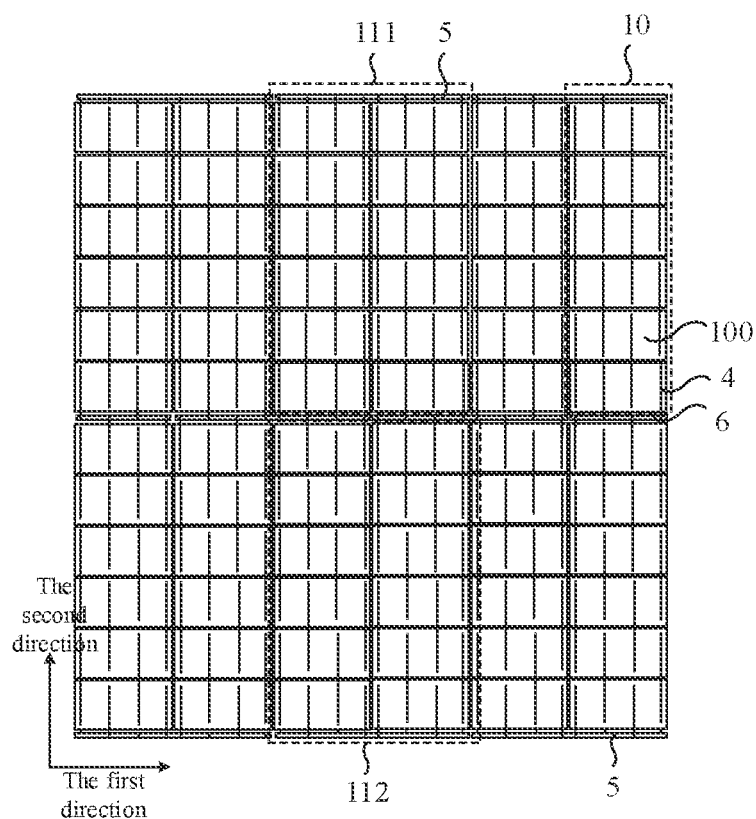
FIG. 9 is a schematic structural view of a photovoltaic module.

As an example, FIG. 9 shows a schematic view of the overall structure of a back-contact photovoltaic module. The existing back-contact photovoltaic module generally adopts a half-piece model. As shown in FIG. 9, the solar cell piece 100 is a cell piece segment; where the cell piece segment may be a cell piece half-segment formed by evenly cutting a cell base piece into two equal pieces along a first direction, or may be a cell piece segment formed by cutting the cell base piece into N pieces along the first direction, where N≥2 and N is a positive integer. For example, the solar cell piece 100 may be a ⅓ cell piece segment formed by evenly cutting the cell base piece into 3 pieces along the first direction, or the solar cell piece 100 may also be a quarter cell piece segment formed by evenly cutting the cell base piece into 4 pieces along the first direction, or the solar cell piece 100 may also be ⅙ cell piece segment formed by evenly cutting the cell base piece into 6 pieces along the first direction.

In a preparation process of the back-contact photovoltaic module, adjacent cell piece segments are connected in series and then connected in parallel to form a photovoltaic module. In order to realize the series connection between different cell strings, it is necessary to ensure that the polarities of adjacent cell strings 10 are opposite. Therefore, it is necessary to rotate another cell string 10 adjacent to the cell string 10 by 180 degrees to ensure that the polarities of the adjacent cell strings 10 are opposite. The polarities of adjacent cell strings 10 are shown in the circuit diagram of the photovoltaic module in FIG. 10. After that, a second bus bar 5 is welded between every two cell strings 10 to realize the series connection of the two cell strings 10. As shown in FIG. 9, two adjacent columns of cell strings 10 (direction of columns is shown as the second direction) are connected in series by the second bus bars 5 located at edges of the cell strings 10 along the second direction, to form a cell unit. The cell unit includes a first cell unit 111 and a second cell unit 112 arranged in sequence along the second direction. FIG. 9 shows a case where the number of the first cell units 111 and the second cell units 112 are both three, each of the three first cell units 111 and the three second cell units 112 includes two of the cell strings 10, and each of the two cell strings 10 includes six solar cell pieces 100 connected in series.

Reference is made back to FIG. 9, the number of the second bus bars 5 of the photovoltaic module is six, where three of the six second bus bars 5 are located at the top of the first cell unit 111 along the second direction, so as to realize the connection of two cell strings 10 in the first cell unit 111, and the other three of the six second bus bars 5 are located at the bottom of the second cell unit 112 along the second direction, so as to realize the connection of the two cell strings 10 in the second cell unit 112. The first cell unit 111 and the second cell unit 112 are connected in parallel by the first bus bar 6. In order to ensure the same polarity of the cell strings 10 in the first cell unit 111, and the same polarity of the cell strings 10 the second cell unit 112, the first cell unit 111 and/or the second cell unit 112 is rotated by 180 degrees, and the connection between the first cell unit 111 and the second cell unit 112 is realized by the first bus bar 6 disposed between the first cell unit 111 and the second cell unit 112, to form the cell unit. Multiple groups of cell units are connected in series or in parallel to form the photovoltaic module.

Figure 10:
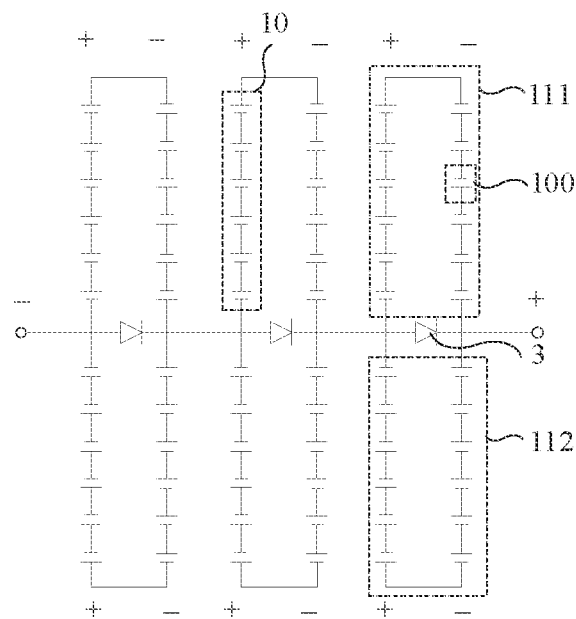
FIG. 10 is a circuit diagram of the photovoltaic module shown in FIG. 9.
Figure 11:
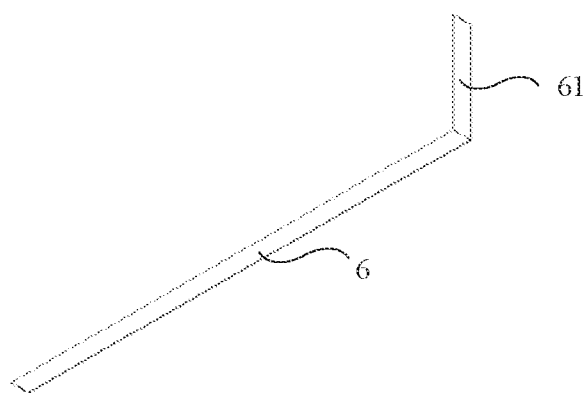
FIG. 11 is a schematic structural view of a first bus bar in the conventional art.
Figure 12:
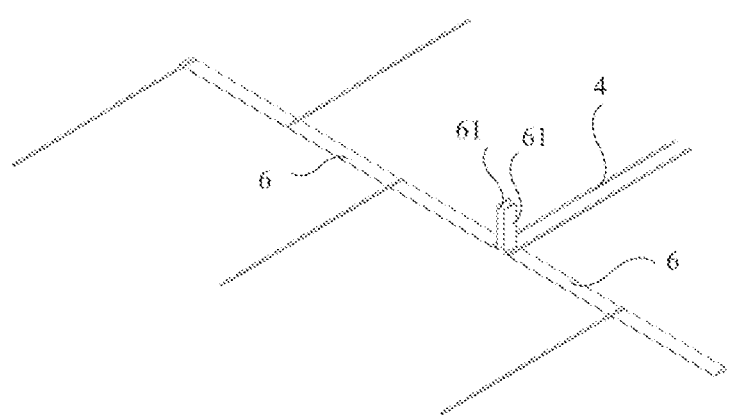
FIG. 12 is a schematic structural view of overlapping adjacent first bus bars in the conventional art.

Generally, the photovoltaic module further includes a junction box, which is arranged on the back plate of the photovoltaic module; the diode 3 is arranged in the junction box, and the junction box is generally located between adjacent cell units. A lead-out wire extends out of an end of the first bus bar 6 for connecting the first cell unit 111 to the second cell unit 112, by which the connection with one end of the diode 3 is realized, and the other end of the diode 3 is connected to the lead-out wire of the first bus bar 6 for connecting adjacent cell unit, so that the connection of adjacent cell units is realized. As shown in FIG. 10, every two cell strings 10 are connected in series to form the first cell unit 111 or the second cell unit 112, and an output end of the first cell unit 111 and an output end of the second cell unit 112 are both connected to the diode 3, that is, the electric energy generated by the cell pieces is drawn out by a lead-out portion 61 of the first bus bar 6, and the lead-out portion 61 is connected to the diode 3. As shown in FIG. 11, the lead-out portion 61 is generally formed by bending the first bus bar 6. Considering the bending radius of the first bus bar 6 and the operability of welding, a distance between the lead-out portion 61 of the first bus bar 6 and the solder strip 4 is generally 10 mm. However, by adopting this solution, the lead-out portions 61 arranged oppositely on the adjacent first bus bars 6 in the photovoltaic module may form overlapping, or a distance between the adjacent lead-out portions 61 may be insufficient. As shown in FIG. 12, the distance between the lead-out portions 61 arranged oppositely on the adjacent first bus bars 6 is excessively small, and a distance between the solder strips 4 located at the edge of the solar cell piece 100 is also excessively small. With the continuous optimization of the back-contact solar cell, the number of subsequent main grids may be further increased, and the distance between the two oppositely arranged lead-out portions 61 will be further reduced, which undoubtedly increases the risk of short circuit between the cell strings 10 and seriously affects the preparation of the back-contact photovoltaic module.

Figure 13:
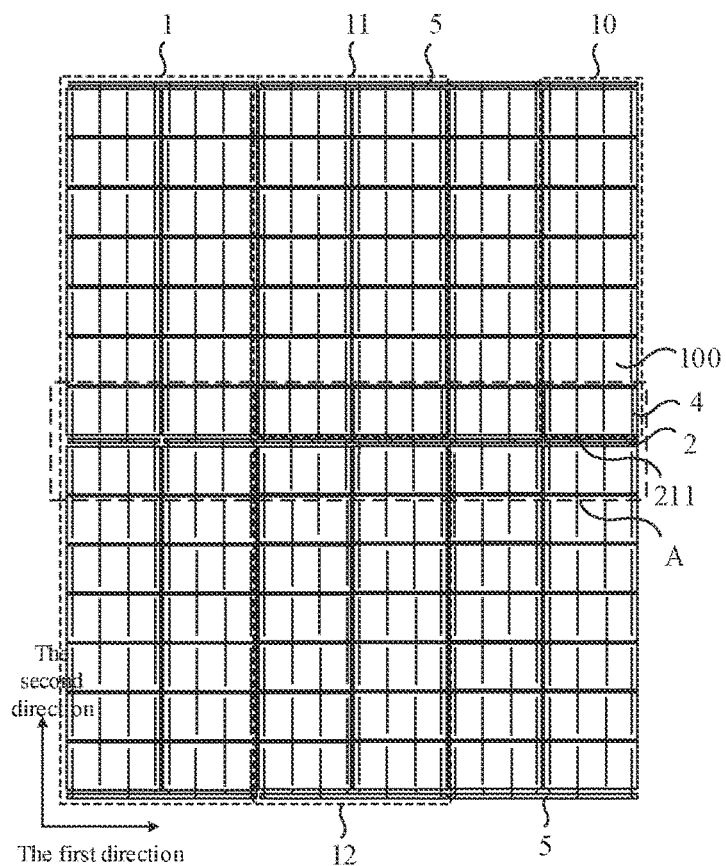
FIG. 13 is a schematic structural view of a photovoltaic module provided according to an embodiment of the present disclosure.

In order to solve the above technical problem, referring to FIG. 13, a photovoltaic module is provided according to an embodiment of the present disclosure, and the photovoltaic module includes: at least one cell unit group 1, where the at least one cell unit group 1 includes multiple cell strings 10 connected in series and/or in parallel, and adjacent cell strings 10 in the plurality of cell strings 10 are connected by a connection structure. The connection structure includes a lead-out structure 2, the lead-out structure includes a main body portion 21, a first connecting portion 211 arranged on the main body portion 21 and a second connecting portion 212 arranged on the main body portion 21, the first connecting portion 211 is disposed parallel to a length direction of the main body portion 21, and the second connecting portion 212 is connected to the first connection portion 211 and extends away from the first connection portion 211. The main body portion 21 has a first edge 22 in the length direction of the main body portion 21, the second connecting portion 212 is closer to the first edge 22 relative to the first connecting portion 211, and a distance between the second connecting portion 212 and the first edge 22 ranges from 2 mm to 20 mm.

It should be noted that, as shown in FIG. 13, the connection structure includes the lead-out structure 2 and the second bus bar 5, where the second bus bar 5 are arranged in two groups, and the two groups of second bus bars 5 are disposed at an upper edge and a lower edge of the photovoltaic module along the second direction, respectively, to realize the series connection between adjacent cell strings 10. The lead-out structure 2 is arranged between the cell units formed after every two groups of cell strings 10 are connected in series, and is configured to lead the current of the cell units out and connect to the diode 3, so as to realize the connection of adjacent cell units.

In some embodiments, the distance between the second connecting portion 212 and the first edge 22 may be 2 mm, 4 mm, 6 mm, 12 mm, 16 mm or 20 mm. Preferably, the distance between the second connecting portion 212 and the first edge 22 ranges from 6 mm to 12 mm.

Figure 14:
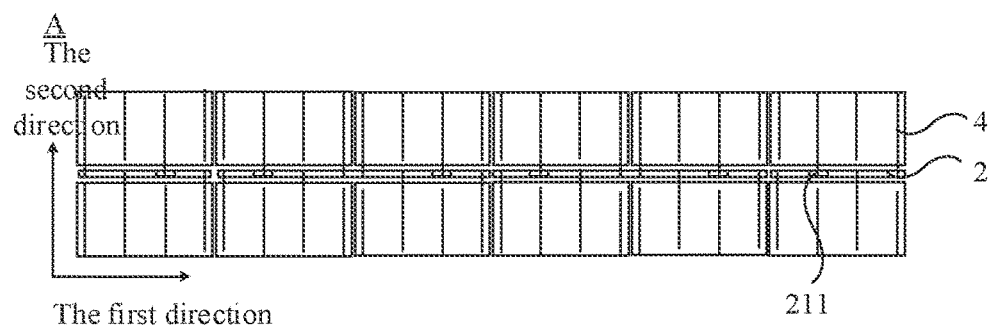
FIG. 14 is a schematic structural view at A shown in FIG. 13.
Figure 15:
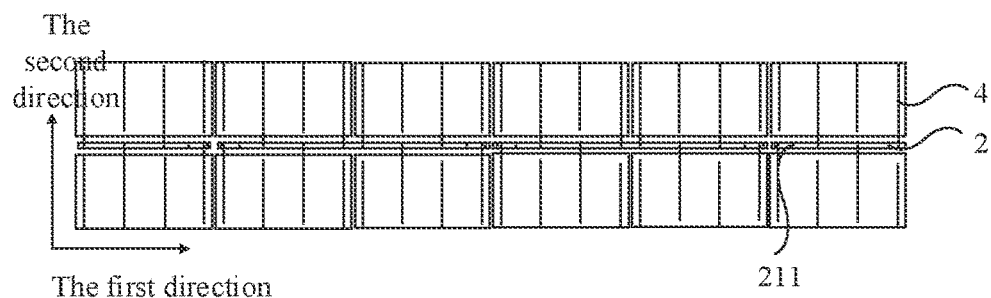
FIG. 15 is a partial schematic view of a photovoltaic module provided according to an embodiment of the present disclosure.
Figure 16:
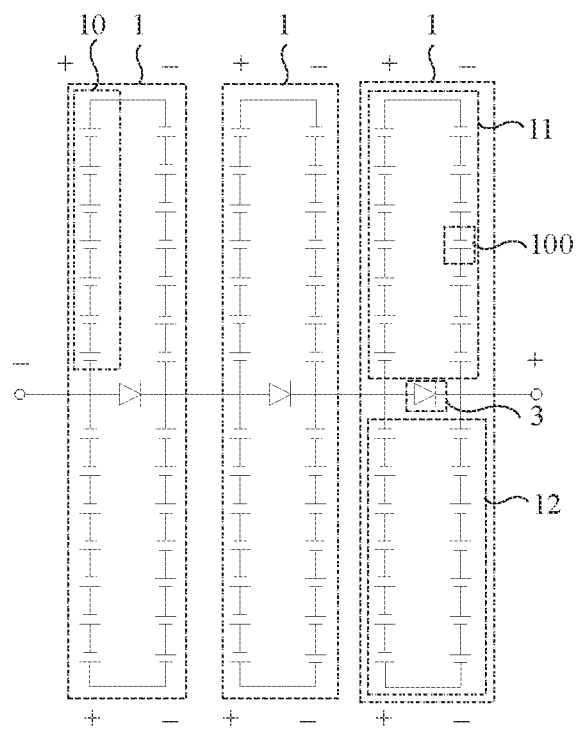
FIG. 16 is a circuit diagram of the photovoltaic module shown in FIG. 13.

Referring to FIG. 14 and FIG. 15, which are both enlarged views at A in FIG. 13. As an example, FIG. 14 shows a schematic view of where the first connecting portion 211 and the second connecting portion 212 are arranged on the main body portion 21. The photovoltaic module shown in FIG. 13 is taken as an example, it can be seen from FIG. 16 that the photovoltaic module includes three cell unit groups 1, and a junction box is arranged between every two adjacent cell unit groups 1, and the lead-out structure 2 extends out of the first connecting portion 211 and the second connecting portion 212 to be connected to the diode 3 in the junction box. It should be noted that the solar cell piece 100 shown in FIG. 13 and FIG. 16 is a cell piece half-segment. As shown in FIG. 14, the number of the lead-out structures 2 are four, all of which are located between two cell units arranged in sequence along the second direction, and the lead-out structure 2 close to the left edge of the photovoltaic module is provided with the first connecting portion 211 and the second connecting portion 212 for cooperatively connecting to a same diode 3 with the adjacent cell unit. The first connecting portion 211 and the second connecting portion 212 are disposed close to the first edge 22 of the lead-out structure 2 relative to the main body portion 21. In this case, the first edge 22 is the right edge of the lead-out structure 2. The lead-out structure 2 close to the right edge of the photovoltaic module is provided with the first connecting portion 211 and the second connecting portion 212. In order to cooperatively connect to the same diode 3 with the adjacent cell unit, the first connecting portion 211 and the second connecting portion 212 are disposed close to the first edge 22 of the lead-out structure 2 relative to the main body portion 21. In this case, the first edge 22 is the left edge of the lead-out structure 2. The number of the first edges 22 on the main body portion 21 may be two. As shown in FIG. 14, each of the two lead-out structures 2 located in the middle of the photovoltaic module is provided with two connecting portions, and the two connecting portions are arranged at two edges close to two side of the main body portion 21 relative to the middle of the main body portion 21. In this case, the number of the first edges 22 is two, which are the two edges of the main body portion 21 along the length direction. In order to ensure that the second connecting portion 212 and the adjacent cell unit are cooperatively connected to the same diode 3, the second connecting portion 212 is close to the first edge 22 on two sides of the main body portion 21 relative to the first connecting portion 211, and the distance between the second connecting portions 212 and the first edge 22 ranges from 2 mm to 20 mm.

FIG. 15 shows a schematic view in which the first connecting portion 211 is arranged close to the edge of the main body portion 21. As an example, FIG. 15 shows a case where the first connecting portion 211 can also be arranged close to the edge of the main body portion 21, a safe distance between second connecting portions 212 of the adjacent cell units is formed to avoid the risk of short circuit of the cell unit.

It should be noted that, as an example, FIG. 13 shows that the photovoltaic module includes three cell unit groups 1, and each of the cell unit groups 1 includes two cell units arranged in sequence along the second direction, and each of the cell units includes two cell strings 10 connected in series, and each of the cell strings 10 includes seven solar cell pieces 100 connected in series. The number of solar cell pieces 100 in each of the cell strings 10, and the number of cell strings 10 in each of the cell units, and the number of the cell unit groups 1 is not limited in the embodiments of the present disclosure.

Figure 17:
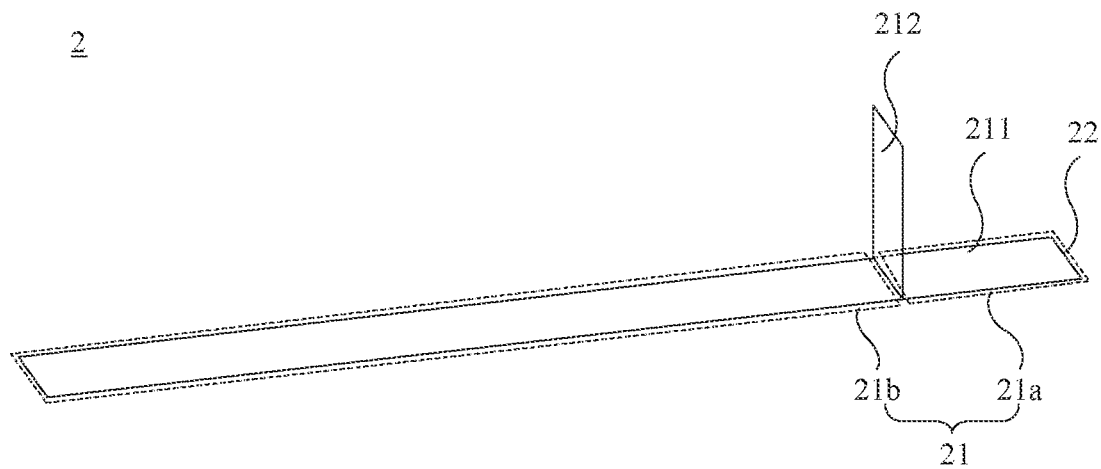
FIG. 17 is a schematic view of a lead-out structure provided according to an embodiment of the present disclosure.

FIG. 17 shows a schematic view of a lead-out structure provided according to an embodiment of the present disclosure. As shown in FIG. 17, the first connecting portion 211 is closer to the first edge 22 relative to the second connecting portion 212. An end of the first connecting portion 211 close to the first edge 22 is connected to the first edge 22, and an end of the first connecting portion 211 away from the first edge 22 is connected to the second connecting portion 212. A distance between the second connecting portion 212 and the first edge 22 ranges from 0.5 mm to 30 mm, that is to say, a distance between the end of the first connecting portion 211 away from the first edge 22 and the first edges 22 ranges from 0.5 mm to 30 mm.

Preferably, the distance between the second connecting portion 212 and the first edge 22 ranges from 2 mm to 20 mm. Generally, in order to ensure a safe distance between the second connecting portion 212 and the first edge 22, avoid the risk of short circuit of the cell unit, and ensure the reliability of the photovoltaic module, the distance between the second connecting portion 212 and the first edge 22 is greater than 2 mm. In some embodiments, the distance between the second connecting portion 212 and the first edge 22 may be 4 mm, 6 mm, 12 mm, 16 mm or 20 mm.

In some embodiments, the first connecting portion 211 covers part of the main body portion 21, and an orthographic projection of the first connecting portion 211 on the main body portion 21 has an overlapping area with the main body portion 21.

Reference is continuously made to FIG. 17, the first connecting portion 211 covers a part of a surface of the main body portion 21 close to the first edge 22, and a portion of the first connecting portion 211 covering the main body portion 21 is referred to as a covering portion. In response to a width of the first connecting portion 211 being greater than a width of the covering portion, the area of the orthographic projection of the first connecting portion 211 in the direction perpendicular to the main body portion 21 is greater than the area of the covering portion. In response to the width of the first connecting portion 211 being smaller than that of the covering portion, the area of the orthographic projection of the first connecting portion 211 in the direction perpendicular to the main body portion 21 is smaller than the area of the covering portion, and the orthographic projection of the first connecting portion 211 on the main body portion 21 is located inside the covering portion.

In some embodiments, the overlapping area coincides with the orthographic projection of the first connecting portion 211 on the main body portion 21.

Reference is continuously made to FIG. 17, in response to the width of the first connecting portion 211 being equal to the width of the covering portion, and a length of the first connecting portion 211 being equal to a length of the covering portion, an orthographic projection of the covering portion on the main body portion 21 perfectly coincides with the orthographic projection of the first connecting portion 211 on the main body portion 21, that is, the overlapping area coincides with the orthographic projection of the first connecting portion 211 on the main body portion 21.

In some embodiments, the end of the first connecting portion 211 away from the first edge 22 is connected to the second connecting portion 212, the first connecting portion 211 is integrally formed with the second connecting portion 212 and the main body portion 21, respectively. As shown in FIG. 17, the end of the first connecting portion 211 close to the first edge 22 is connected to the first edge 22 of the main body portion 21, and the end of the first connecting portion 211 away from the first edge 22 is connected to the second connecting portion 212. The first connecting portion 211 is integrally formed with the second connecting portion 212 and the main body portion 21, respectively. A bus strip can be used as the main body portion 21, which is bent to obtain the lead-out structure 2.

In some embodiments, in a direction perpendicular to the length direction of the main body portion 21, the main body portion 21 is provided with a first bending line 201 and a second bending line 202, the first bending line 201 is located at a junction of the main body portion 21 and the first connecting portion 211, and the second bending line 202 is located at a junction of the first connecting portion 211 and the second connecting portion 212. In a thickness direction of the main body portion 21, the first bending line 201 is disposed directly opposite to the first edge 22, and the second bending line 202 is disposed directly opposite to the edge of the first connecting portion 211 facing away from the first edge 22.

Figure 18:
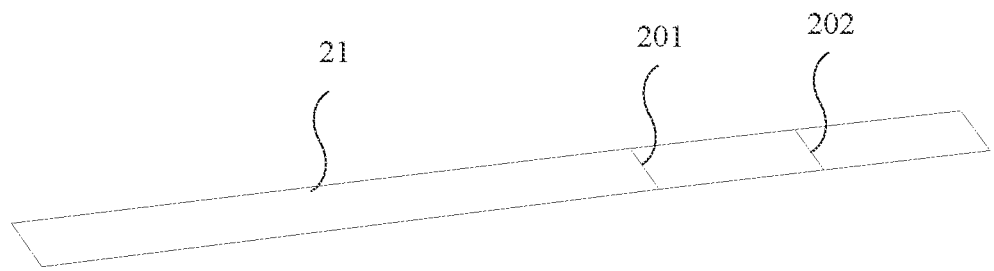
FIG. 18 is a schematic view of tiling a lead-out structure provided according to an embodiment of the present disclosure before the lead-out structure is bent.
Figure 19:
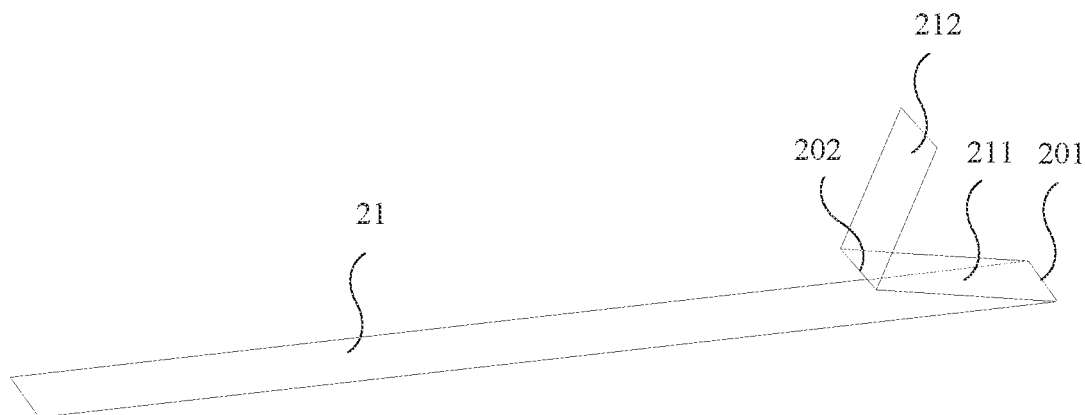
FIG. 19 is a schematic view of bending a lead-out structure provided according to an embodiment of the present disclosure.

In response to the main body portion 21, the first connecting portion 211 and the second connecting portion 212 being integrally formed, a bus strip is served as the main body portion 21. Referring to FIG. 18, the strip-shaped main body portion 21 is sequentially provided with the first bending line 201 and the second bending line 202. The main body portion 21 is bent first along the direction of the first bending line 201 towards the main body portion 21, so that the main body portion 21 located on the right side of the first bending line 201 partially overlaps with the main body portion 21 located on the left side of the first bending line 201. In this case, the second bending line 202 is located on the bent part covering part of the surface of the main body portion 21, and the bent part is bent again along the second bending line 202 of the main body portion 21, as shown in FIG. 19. Finally, the lead-out structure as shown in FIG. 17 is obtained, the first connecting portion 211 covering part of the main body portion 21 and the second connecting portion 212 perpendicular to the first connecting portion 211 are formed, and the first connecting portion 211 and the main body portion 21 are welded and fixed, so that the lead-out structure 2 is obtained.

Reference is continuously made to FIG. 17, in the length direction of the main body portion 21, the main body portion 21 includes a first main body portion 21a and a second main body portion 21b. In a thickness direction of the main body portion 21, the first main body portion 21 is disposed opposite to the first connecting portion 211, the first main body portion 21a and the second main body portion 21b together form the main body portion 21. In the thickness direction of the main body portion 21, a thickness of the first main body portion 21a is less than or equal to a thickness of the second main body portion 21b.

In some embodiments, in order to avoid excessive thickness of the main body portion 21 after the first connecting portion 211 is welded, which may result in a lack of glue in the subsequent connection with the solder strip 4, a thickness of the first main body portion 21a of the main body portion 21 facing toward the first connecting portion 211 is appropriately reduced to avoid excessive thickness of a part of the main body portion 21 due to the overlapping of the first main body portion 21a and the first connecting portion 211 after the main body portion 21 is welded with the first connecting portion 211, so as to avoid the effect on the layout of the photovoltaic module.

Figure 20:
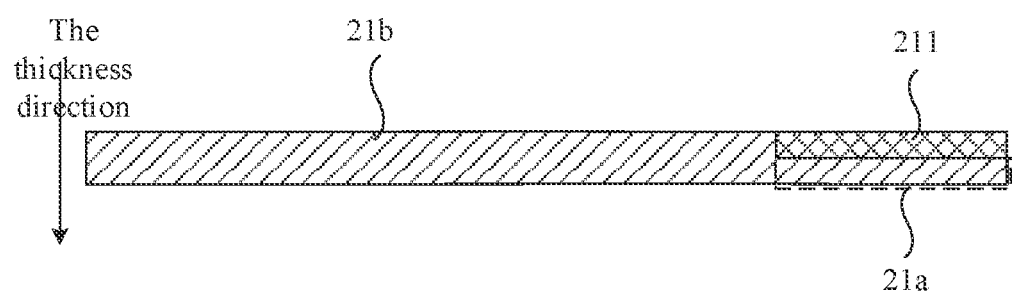
FIG. 20 is a cross-sectional view of a lead-out structure provided according to an embodiment of the present disclosure.

Preferably, the thickness of the first main body portion 21a is smaller than the thickness of the second main body portion 21b. Since the first main body portion 21a and the first connecting portion 211 are arranged overlappingly, in order to avoid the excessive thickness of the first connecting portion 211 and the first main body portion 21a of the lead-out structure 2 after being bent, which affects the performance of the lead-out structure 2, the thickness of the first main body portion 21a is reduced. As shown in FIG. 20, the thickness of the first main body portion 21a may be half of the thickness of the second main body portion 21b, and the thickness of the first connecting portion 211 is approximately equal to the thickness of the first main body portion 21a. In this case, the overall thickness of the main body portion 21a and the first connecting portion 211 after overlapping is approximately equal to the thickness of the second main body portion 21b, so as to ensure the overall performance of the lead-out structure 2. In this case, it is also beneficial to the overall layout of the photovoltaic module. After the second connecting portion 212 is arranged on the main body portion 21, the thickness of the main body portion 21 will not be increased excessively, so as to ensure that the photovoltaic module can be arranged on the original layout.

In some embodiments, the first main body portion 21a is fixedly connected to the first connecting portion 211 in a back-to-back manner.

Reference is continuously made to FIG. 20, in order to ensure the integrity of the lead-out structure 2, the first main body portion 21a is fixedly attached to the first connecting portion 211 in a back-to-back manner, that is, an upper surface of the first main body portion 21a is attached to a lower surface of the first connecting portion 211, and the upper surface of the first main body portion 21a is welded to the lower surface of the first connecting portion 211 by soldering, so as to fix the first main body portion 21a and the first connecting portion 211 together, thereby fixing the main body portion 21 and the lead-out structure 2 together.

Figure 21:
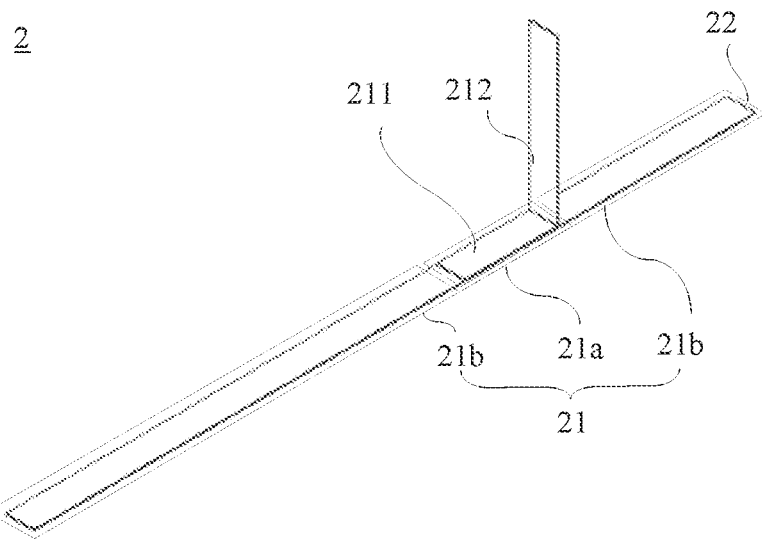
FIG. 21 is a schematic view of a lead-out structure provided according to another embodiment of the present disclosure.

Referring to FIG. 21, in some embodiments, in the length direction of the main body portion 21, the main body portion 21 includes a first main body portion 21a and a second main body portion 21b. In a thickness direction of the main body portion 21, the first main body portion 21 is disposed opposite to the first connecting portion 211, the first main body portion 21a and the second main body portion 21b together form the main body portion 21. In the thickness direction of the main body portion 21, a thickness of the first main body portion 21a is less than or equal to a thickness of the second main body portion 21b.

In some embodiments, as shown in FIG. 21, in the width direction of the main body portion 21, a width of the second main body portion 21b is equal to a width of the first main body portion 21a.

In some embodiments, the first connecting portion 211 and the second connecting portion 212 are located on the first main body portion 21a, and orthographic projections of the second main body portion 21b, the first connecting portion 211 and the second connecting portion 212 on the main body portion 21 have no overlapping area. Specifically, in the length direction of the main body portion 21, a distance between the orthographic projection of the second main body portion 21b on the main body portion 21 and the orthographic projections of the first connecting portion 211 and the second connecting portion 212 on the main body portion 21 is greater than or equal to 0 and less than or equal to 5 mm, to avoid the risk of short circuit of the solar cell, so as to ensure the reliability of the photovoltaic module.

Figure 22A:
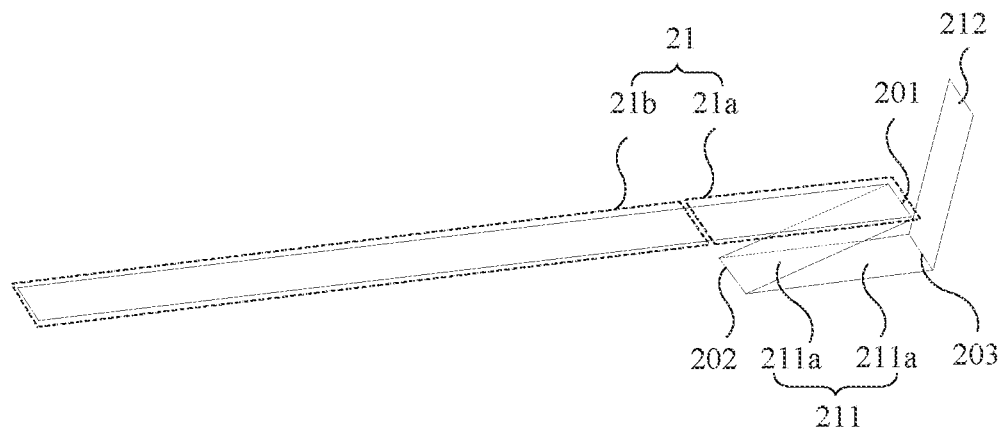
FIG. 22A is a schematic view of bending a lead-out structure provided according to another embodiment of the present disclosure.

As shown in FIG. 22A, an area where the first connecting portion 211 overlaps with the main body portion 21 is the first main body portion 21a, an area where the first connecting portion 211 does not overlap with the main body portion 21 is the second main body portion 21b, and the first main body portion 21a and the second main body portions 21b together form the main body portion 21. In order to avoid excessive thickness of the main body portion 21 after the first connecting portion 211 is welded to the main body portion 21, which may result in a lack of glue in the subsequent connection with the solder strip 4, a thickness of the first main body portion 21a of the main body portion 21 facing toward the first connecting portion 211 is appropriately reduced to avoid excessive thickness of a part of the main body portion 21 due to the overlapping of the first main body portion 21a and the first connecting portion 211 after the main body portion 21 is welded with the first connecting portion 211, so as to avoid the effect on the layout of the photovoltaic module.

Figure 22B:
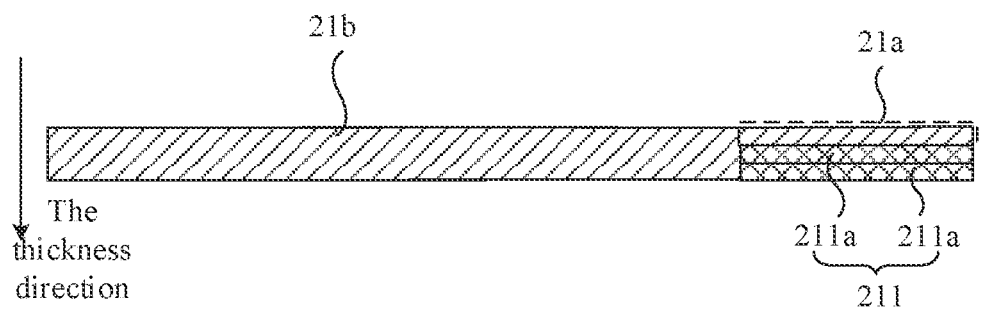
FIG. 22B is a cross-sectional view of a lead-out structure provided according to another embodiment of the present disclosure.

Preferably, the thickness of the first main body portion 21a is smaller than the thickness of the second main body portion 21b. Since a first sub-connecting portion 211a and the first main body portion 21a are welded together in two layers, in order to prevent the thickness of the main body portion 21 from being excessive after the first sub-connecting portion 211a and the first main body portion 21a are welded together, as shown in FIG. 22B, the thickness of the first main body portion 21a is one third of the thickness of the second main body portion 21b, and a thickness of the first sub-connecting portion 211a is one third of the thickness of the second main body portion 21b, so that the thickness of the first sub-connecting portion 211a is approximately equal to the thickness of the first main body portion 21a. In this case, it can be ensured that the total overlapping thickness of the first sub-connecting portions 211a and the first main body portion 21 is approximately equal to the thickness of the second main body portion 21b, so as to ensure that the overall performance of the lead-out structure 2, thereby preventing the layout of the photovoltaic module from being adversely affected.

Figure 23A:
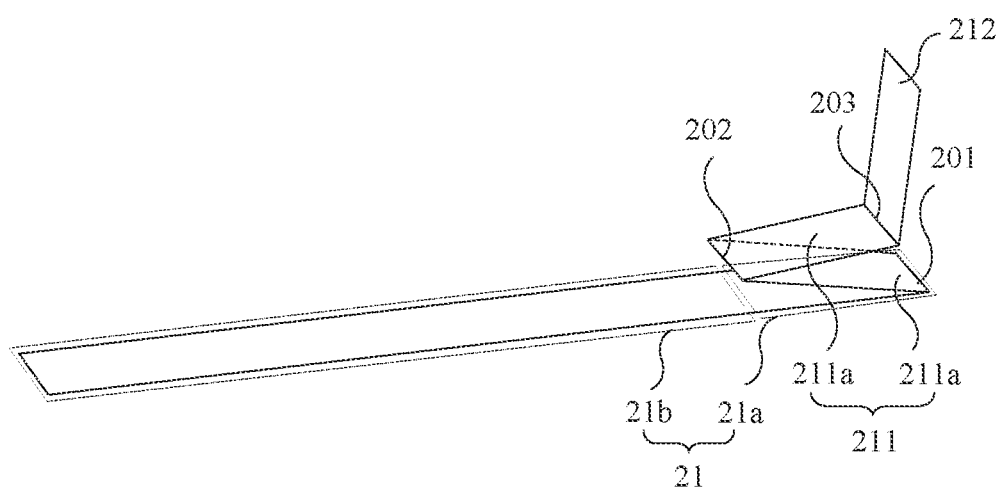
FIG. 23A is a schematic view of bending a lead-out structure provided according to another embodiment of the present disclosure.

In other embodiments, the lead-out structure provided according to the embodiments of the present disclosure can also be formed by other bending methods, the lead-out structure shown in FIG. 23A can also be obtained by bending the lead-out structure shown in FIG. 22A by three times. Specifically, the first bending is performed by bending a part of the bus strip located at the right side of the first bending line 201 along the first bending line 201 to above of the main body portion 21 (inwardly bending). The second bending is performed by bending a part of the bus strip located above the main body portion 21a along the second bending line 201, so that the bent bus strip is parallel to the main body portion 21. The third bending is performed by bending the bus strip bent in the second bending along the third bending line 203 (upwardly bending) to form the second connecting portion 212 extending out of the main body portion 21. In this case, the preparation of the lead-out structure can be more convenient, and the overall stability of the lead-out structure 2 can be ensured.

Specifically, referring to FIG. 23A, in a direction perpendicular to the length direction of the main body portion 21, the first bending line 201 is arranged at a junction of the main body portion 21 and the first connecting portion 211, and the first connecting portion 211 includes two layers of the first sub-connecting portion 211a. The second bending line 202 is arranged at a junction of the two first sub-connecting portions 211a, and the third bending line 203 is arranged at a junction of the first sub-connecting portion 211a and the second connecting portion 212. In the thickness direction of the main body portion 21, the first bending line 201 and the third bending line 203 both face toward the first edge 22, and the second bending line 202 faces toward the edge of the first connecting portion 211 away from the first edge 22. The first connecting portion 211 formed by bending the main body portion 21 is located on the upper surface of the main body portion 21, the first connecting portion 211 is parallel to the main body portion 21, and the second connecting portion 212 is perpendicular to the first connecting portion 211.

As shown in FIG. 23A, an area where the first connecting portion 211 overlaps with the main body portion 21 is the first main body portion 21a, an area where the first connecting portion 211 does not overlap with the main body portion 21 is the second main body portion 21b, and the first main body portion 21a and the second main body portions 21b together form the main body portion 21. In order to avoid excessive thickness of the main body portion 21 after the first connecting portion 211 is welded to the main body portion 21, which may result in a lack of glue in the subsequent connection with the solder strip 4, a thickness of the first main body portion 21a of the main body portion 21 facing toward the first connecting portion 211 is appropriately reduced to avoid excessive thickness of a part of the main body portion 21 due to the overlapping of the first main body portion 21a and the first connecting portion 211 after the main body portion 21 is welded with the first connecting portion 211, so as to avoid the effect on the layout of the photovoltaic module.

Figure 23B:
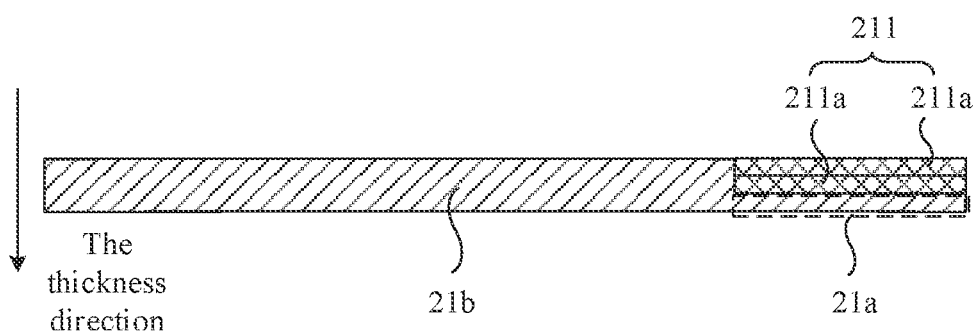
FIG. 23B is a cross-sectional view of a lead-out structure provided according to another embodiment of the present disclosure.

Preferably, the thickness of the first main body portion 21a is smaller than the thickness of the second main body portion 21b. Since a first sub-connecting portion 211a and the first main body portion 21a are welded together in two layers, in order to prevent the thickness of the main body portion 21 from being excessive after the first sub-connecting portion 211a and the first main body portion 21a are welded together, as shown in FIG. 23B, the thickness of the first main body portion 21a is one third of the thickness of the second main body portion 21b, and a thickness of the first sub-connecting portion 211a is one third of the thickness of the second main body portion 21b, so that the thickness of the first sub-connecting portion 211a is approximately equal to the thickness of the first main body portion 21a. In this case, it can be ensured that the total overlapping thickness of the first sub-connecting portions 211a and the first main body portion 21 is approximately equal to the thickness of the second main body portion 21b, so as to ensure that the overall performance of the lead-out structure 2, thereby preventing the layout of the photovoltaic module from being adversely affected.

Figure 24:
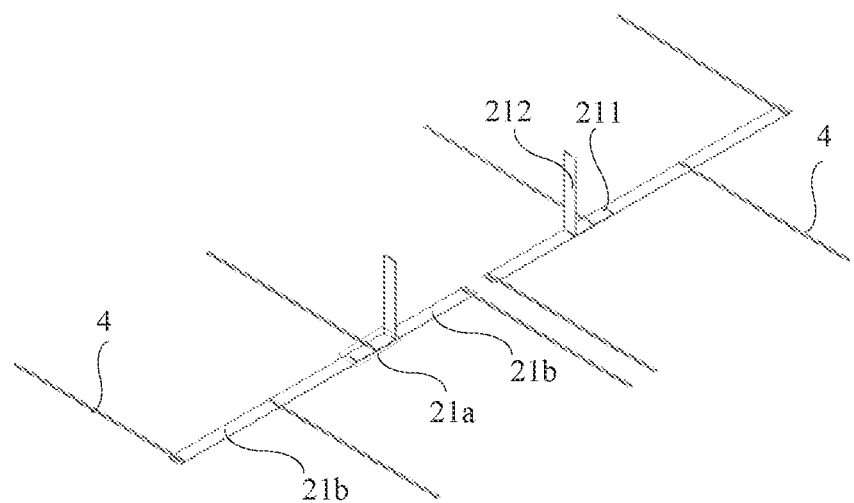
FIG. 24 is a schematic view of positional relationship of adjacent lead-out structures provided according to an embodiment of the present disclosure.

As shown in FIG. 24, in the embodiments of the present disclosure, the first connecting portion 211 and the second connecting portion 212 are arranged on the main body portion 21. The first connecting portion 211 is parallel to the length direction of the main body portion 21, and the second connecting portion 212 extends out of the first connecting portion 211. In some embodiments, the first connecting portion 211 is perpendicular to the second connecting portion 212. An end of the second connecting portion 212 extending out of the first connecting portion 211 is connected to the diode 3, and an end of the solder strip 4 welded on the solar cell piece 100 extending out of the solar cell piece 100 is connected to the lead-out structure 2 except for the second connecting portion 212. That is to say, the end of the solder strip 4 extending out of the solar cell piece 100 may be connected to the main body portion 21, or may be connected to the first connecting portion 211.

In some embodiments, in order to avoid excessive thickness of the main body portion 21 after the first connecting portion 211 and the second connecting portion 212 are welded, resulting in a lack of glue in the subsequent connection with the solder strip 4, the thickness of the first main body portion 21a of the main body portion 21 is reduced to ensure the thickness of the first main body portion 21a after the main body portion 21 is welded to the first connecting portion 211 and the second connecting portion 212.

Figure 25:
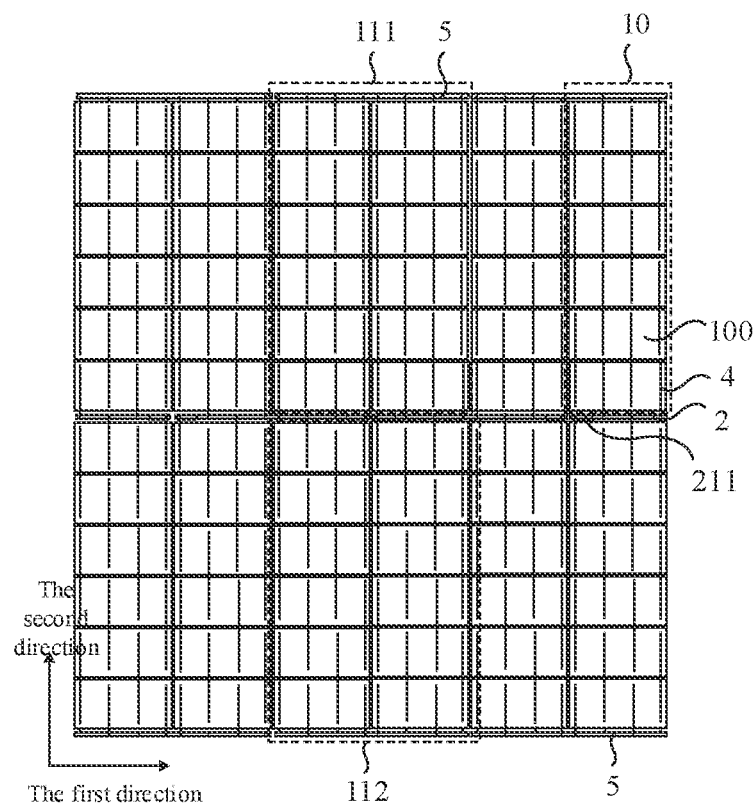
FIG. 25 is a schematic structural view of a photovoltaic module provided according to another embodiment of the present disclosure.

It can be understood that the lead-out structure 2 provided according to the embodiments of the present disclosure can also be used for the connection of adjacent cell strings of the back-contact photovoltaic module shown in FIG. 9. As shown in FIG. 25, the back-contact photovoltaic module includes multiple cell unit groups 1 connected in parallel, and each of the multiple cell unit groups 1 includes a first cell unit 11 and a second cell unit 12, and each of the first cell unit 11 and the second cell unit 12 includes two cell strings 10 connected in series. The two cell strings 10 of the first cell unit 11 are connected together by a second bus bar 5 located on the top of the first cell unit 11, and the two cell strings 10 of the second cell unit 12 are connected together by a second bus bar 5 located at the bottom of the first cell unit 11. The lead-out structure 2 is disposed between the first cell unit 11 and the second cell unit 12, and the first cell unit 11 and the second cell unit 12 are also connected by the lead-out structure 2. The adjacent lead-out structures 2 are respectively connected to the diode 3 by the second connecting portions 212 arranged on the main body portions 21.

Figure 26:
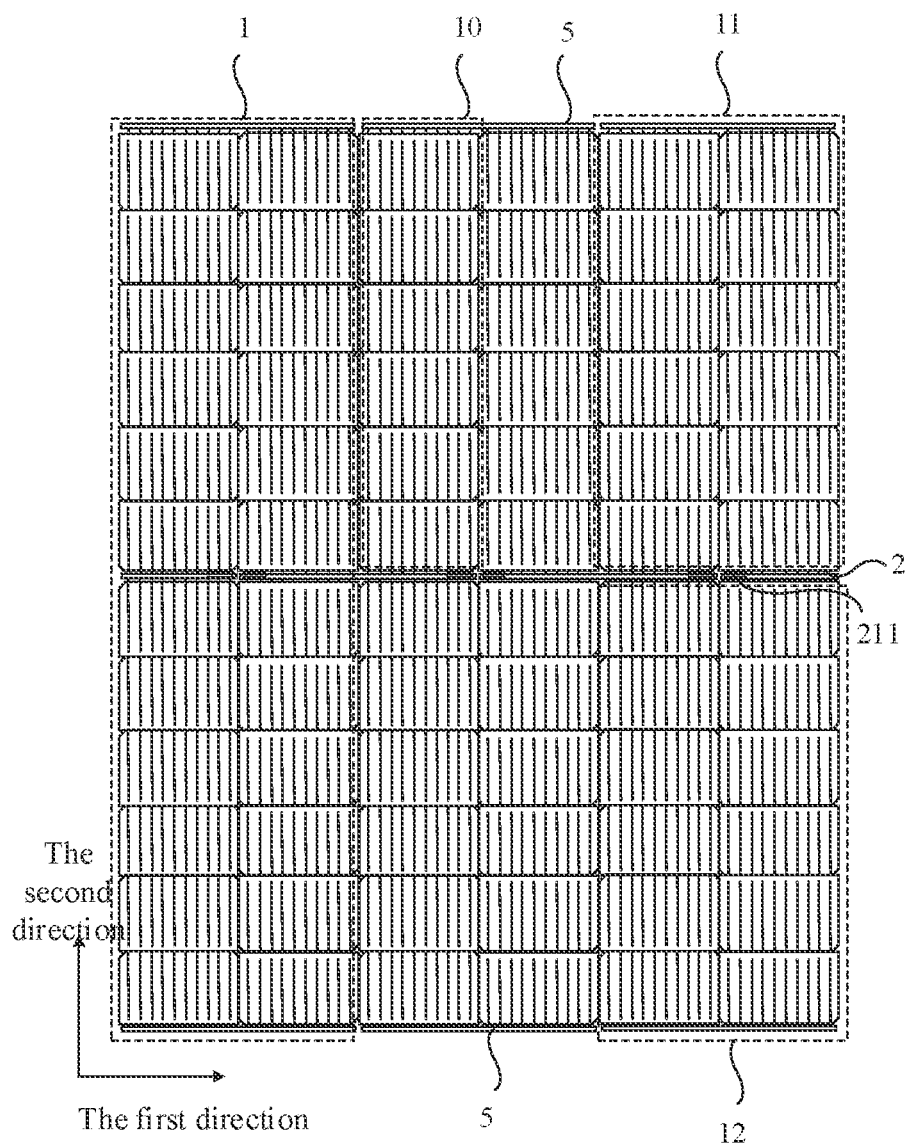
FIG. 26 is a schematic structural view of a photovoltaic module provided according to yet another embodiment of the present disclosure.

The lead-out structure 2 provided according to the embodiments of the present disclosure can also be configured to connect cell strings of the conventional photovoltaic module. As shown in FIG. 26, the lead-out structure 2 is arranged between the first cell unit 11 and the second cell unit 12, and the cell string 10 of first cell unit 11 and the cell string 10 of the second cell unit 12 are connected together by the lead-out structure 2.

In some embodiments, in the thickness direction of the main body portion 21, the thickness of the first connecting portion 211 is less than or equal to the thickness of the first main body portion 21a, or the thickness of the first connecting portion 211 is less than or equal to the thickness of the second main body portion 21b.

It should be noted that, the thickness of the first connecting portion 211 may be equal to the thickness of the first main body portion 21*a*, and may also be equal to the thickness of the second main body portion 21*b*.

Preferably, the thickness of the first main body portion 21*a* may range from 0.2 mm to 0.4 mm, for example, the thickness of the first main body portion 21*a* may be 0.2 mm, 0.23 mm, 0.3 mm, 0.35 mm or 0.4 mm. The thickness of the second main body portion 21*b* may range from 0.4 mm to 0.8 mm, for example, the thickness of the second main body portion 21*b* may be 0.4 m, 0.5 m, 0.6 m, 0.7 m or 0.8 m.

In some embodiments, the length of the first connecting portion 211 is less than or equal to the height of a part of the second connecting portion 212 extending out of the main body portion 21.

For example, the length of the first connecting portion 211 is approximately range from 20% to 40% of the length of the main body portion 21. In a preferred embodiment, the length of the first connecting portion 211 is less than or equal to the height of the part of the second connecting portion 212 extending out of the main body portion 21, so as to prevent the overall thickness of the main body portion 21 from being affected due to the excessive length of the first connecting portion 211.

In some embodiments, a ratio of the length of the first connecting portion 211 to the height of the part of the second connecting portion 212 extending out of the main body portion 21 ranges from 0.4 to 1. For example, the ratio of the length of the first connecting portion 211 to the height of the part of the second connecting portion 212 extending out of the main body portion 21 may be 0.4, 0.5, 0.6, 0.7, 0.8 or 1. Preferably, the ratio of the length of the first connecting portion 211 to the height of the part of the second connecting portion 212 extending out of the main body portion 21 is 0.6.

For example, the height of the part of the second connecting portion 212 extending out of the main body portion 21 may be 8 mm, and the length of the first connecting portion 211 along the length direction of the main body portion 21 approximately ranges from 3 mm to 8 mm. Preferably, the length of the first connecting portion 211 along the length direction of the main body portion 21 ranges from 4 mm to 5 mm.

In some embodiments, the first connecting portion 211 and the second connecting portion 212 are integrally formed, and the first connecting portion 211 and the second connecting portion 212 are fixedly connected to the main body portion 21.

Preferably, the first connecting portion 211 and the second connecting portion 212 can be realized by bending a bus strip, and the first connecting portion 211 and the second connecting portion 212 are welded on the main body portion 21.

In some embodiments, the first connecting portion 211 and the second connecting portion 212 are separate structures. After the first connecting portion 211 and the second connecting portion 212 are welded together, and the first connecting portion 211 and the second connecting portion 212 are welded to the main body portion 21.

In some embodiments, in the width direction of the main body portion 21, the width of the second main body portion 21*b* is smaller than or equal to the width of the first main body portion 21*a*.

In some embodiments, as shown in FIG. 21, in the thickness direction of the main body portion 21, the thickness of the first main body portion 21*a* is equal to the thickness of the second main body portion 21*b*.

Figure 27:
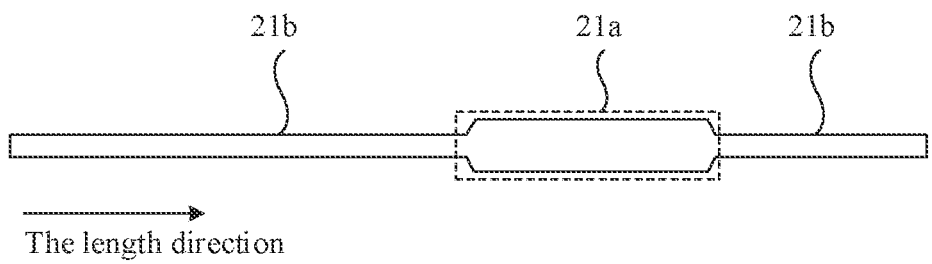
FIG. 27 is a top view of a main body portion provided according to an embodiment of the present disclosure.
Figure 28:
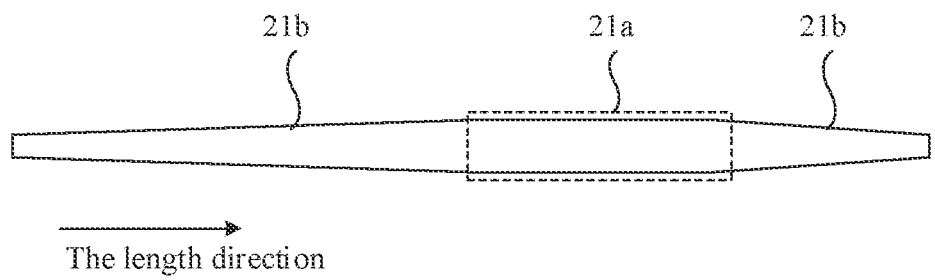
FIG. 28 is a top view of a main body portion provided according to another embodiment of the present disclosure.

In other embodiments, FIG. 27 and FIG. 28 show top views of the main body portion 21. As can be seen from FIG. 27 and FIG. 28, in the width direction of the main body portion 21, the width of the first main body portion 21*a* is greater than the width of the second main body portion 21*b*. As shown in FIG. 28, the width of the second main body portion 21*b* gradually decreases in the direction away from the left edge of the first main body portion 21*a*, and the width of the second main body portion 21*b* gradually decreases in the direction away from the right edge of the first main body portion 21*a*.

Figure 29:
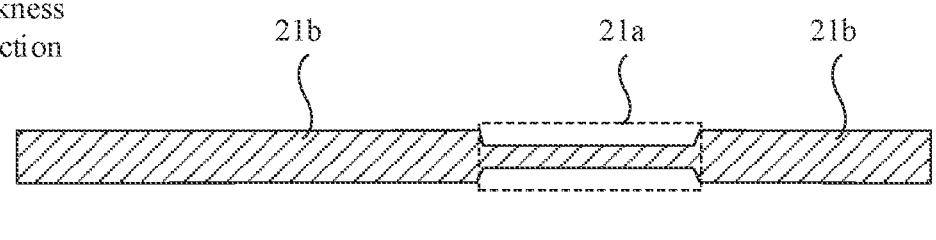
FIG. 29 is a cross-sectional view of a main body portion provided according to an embodiment of the present disclosure.
Figure 30:
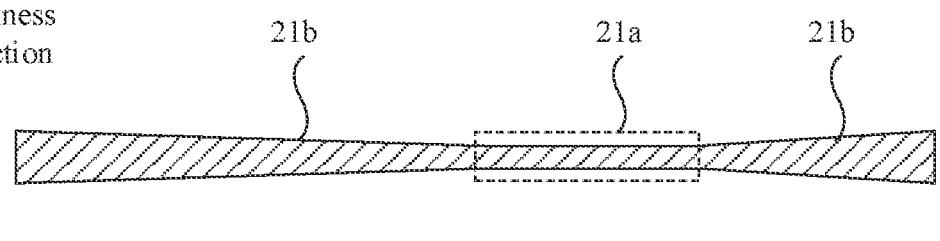
FIG. 30 is a cross-sectional view of a main body portion provided according to an embodiment of the present disclosure.

In other embodiments, in the thickness direction of the main body portion 21, the thickness of the first main body portion 21*a* is smaller than the thickness of the second main body portion 21*b*. As an example, FIG. 29 and FIG. 30 show cross-sectional views of the main body portion 21. As shown in FIG. 30, the width of the second main body portion 21*b* gradually increases in the direction away from the left edge of the first main body portion 21*a*, and the width of the second main body portion 21*b* gradually increases in the direction away from the right edge of the first main body portion 21*a*. In the main body portion 21 of the embodiments of the present disclosure, the thickness of the first main body portion 21*a* is smaller than the thickness of the second main body portion 21*b*, and the width of the second main body portion 21*b* is smaller than the width of the first main body portion 21*a*, which is beneficial to the overall layout of the photovoltaic module. In a case where the first main body portion 21*a* of the main body portion 21 is welded to the first connecting portion 211 or the second connecting portion 212, widths of two ends of the main body portion 21 will not be increased to ensure that the photovoltaic module is arranged on the original layout.

In some embodiments, in the cross section of the main body portion 21 along the thickness direction, the area of the cross section of the first main body portion 21*a* is equal to the area of the cross section of the second main body portion 21*b*.

In some embodiments, the area of the cross section of the first main body portion 21*a* is substantially equal to the area of the cross section of the second main body portion 21*b*. Due to process reasons, the area of the cross section of the first main body portion 21*a* may vary by 10% from the area of the cross section of the second main body portion 21*b*. It should be noted that the bus bar generally includes a solder core and a coating covering the outside of the solder core. In the cross section of the main body portion 21 along the thickness direction, the area of the cross section of the solder core of the first main body portion 21*a* is equal to the area of the cross section of the solder core of the second main body portion 21*b*.

In some embodiments, as shown in FIG. 13, the cell string 10 includes multiple solar cell pieces 100 connected in series, and the solar cell pieces 100 are provided with bus bars. The cell unit group 1 includes the first cell unit 11 and the second cell unit 12 arranged in sequence along the first direction. The first direction is the extending direction of the main grid, and the extending direction of the main grid intersects the length direction of the main body portion 21. The lead-out structure 2 is arranged between the first cell unit 11 and the second cell unit 12, and the cell strings 10 of the first cell unit 11 and the cell strings 10 of the second cell unit 12 are both connected to the main body portion 21, or the first connecting portion 211.

It should be noted that the extending direction of the busbar intersects the longitudinal direction of the main body portion 21. Here, the extending direction of the busbar and the longitudinal direction of the main body portion 21 may be perpendicular, or may be substantially perpendicular.

In some embodiments, the diode 3 is further provided between the first cell unit 11 and the second cell unit 12, a positive electrode of the diode 3 is connected to the second connecting portion 212, or a negative electrode of the diode 3 is connected to the second connecting portion 212.

Reference is made to FIG. 16, which is a circuit diagram corresponding to the photovoltaic module shown in FIG. 13. It can be seen from FIG. 16 that the diode 3 is disposed between the first cell unit 11 and the second cell unit 12, and two ends of the diode 3 are respectively connected to the cell strings 10 in the adjacent cell units. The lead-out structure 2 is disposed between the first cell unit 11 and the second cell unit 12, and one end of each of adjacent second connecting portions 212 extending out of the first connecting portion 211 is connected to the positive electrode and the negative electrode of the diode 3, respectively.

Referring to FIG. 13, in some embodiments, the first cell unit 11 and the second cell unit 12 are both connected to the main body portion 21 or the first connecting portion 211 by the solder strip 4. The extending direction of the solder strip 4 intersects with the length direction of the main body portion 21. The directions intersect. An end of the solder strip 4 extending out of the cell unit group 1 is connected to the main body portion 21, or the first connecting portion 211.

Figure 31:
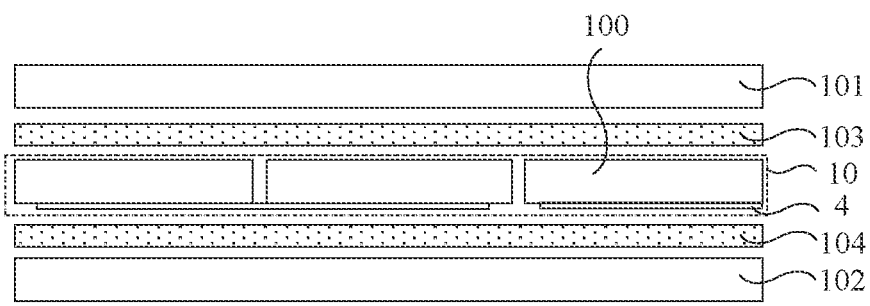
FIG. 31 is a schematic structural view of a photovoltaic module provided according to yet another embodiment of the present disclosure.

Referring to FIG. 31, in some embodiments, the above photovoltaic module further includes: a cover plate 101 configured to cover an upper surface of the multiple cell strings 10, a back plate 102 configured to cover a back surface of the multiple cell strings 10. For the back-contact photovoltaic module, the solder strip 4 is arranged on the back surface of the solar cell piece 100, to connect the positive main grid to the negative main grid. A junction box is generally arranged on the back plate 102, the diode 3 is disposed in the junction box, and the diode 3 is connected to the second connecting portion. An adhesive layer provided between the multiple cell strings 10 and the cover plate 101 and between the multiple cell strings 10 and the back plate 102.

Figure 32:
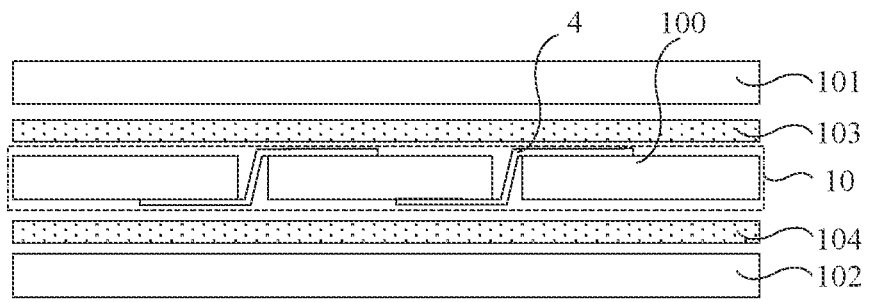
FIG. 32 is a schematic structural view of a photovoltaic module provided according to still another embodiment of the present disclosure.

In other embodiments, as shown in FIG. 32, for a conventional photovoltaic module, the positive main grid and the negative main grid are connected together by the solder strip 4. One end of the solder strip 4 is located on the back surface of the solar cell piece 100, and the other end of the solder strip 4 is located on the upper surface of the solar cell piece 100.

Specifically, in some embodiments, multiple cell strings 10 are connected by a connecting structure. An encapsulation layer covers a front surface and a back surface of the solar cell. Specifically, the adhesive layer includes a first adhesive layer 103 and a second adhesive layer 104. The first adhesive layer 103 is disposed between the cell string 10 and the cover plate 101 to fix of the cell string 10 and the cover plate 101. The second adhesive layer is disposed between the cell strings 10 and the back plate 102 to fix the cell string 10 and the back plate 102. In some embodiments, the cover plate 101 may be embodied as a light-transmitting cover plate, such as a glass cover plate, a plastic cover plate, or the like.

A photovoltaic module is provided according to the embodiments of the present disclosure, the first connecting portion 211, and the second connecting portion 212 for connecting to the diode 3 are arranged on the main body portion 21 of the lead-out structure 2. The second connecting portion 212 is arranged close to the first edge 22 of the main body portion 21 in the length direction of the main body portion 21. The distance between the second connecting portion 212 and the first edge 22 ranges from 2 mm to 20 mm. In the embodiments of the present disclosure, the first connecting portion 211 and the second connecting portion 212 are arranged on the lead-out structure 2, where the first connecting portion 211 is arranged in parallel to the main body portion 21, and the second connecting portion 212 extends out of the first connecting portion 211 to be connected to the diode 3. In addition, there is a distance between the second connecting portion 212 and the edge of the main body portion 21 of the lead-out structure 2 of the embodiment of the present disclosure, so that there is a distance between two second connecting portions 212 respectively connected to two ends of the diode 3, so as to avoid the risk of short circuit between cell strings 10, thereby ensuring the reliability of the photovoltaic module and reducing the difficulty of preparing the photovoltaic module.

Those of ordinary skill in the art can understand that the above embodiments are specific examples for realizing the present disclosure, and in actual disclosures, various changes may be made in form and details without departing from the spirit and range of the present disclosure. Any person skilled in the art can make their own changes and modifications without departing from the spirit and scope of the present disclosure. Therefore, the protection scope of the present disclosure should be subject to the scope defined by the claims.

What is claimed is:

1. A photovoltaic module, comprising:
    at least one cell unit group, wherein the at least one cell unit group comprises a plurality of cell strings connected in series and/or in parallel, and adjacent cell strings in the plurality of cell strings are connected by a connection structure;
    wherein the connection structure comprises a lead-out structure, the lead-out structure comprises a main body portion, a first connecting portion arranged on the main body portion and a second connecting portion arranged on the main body portion, the first connecting portion is disposed parallel to a length direction of the main body portion, and the second connecting portion is connected to the first connection portion and extends away from the first connecting portion;
    the main body portion has a first edge in the length direction of the main body portion, the second connecting portion is closer to the first edge relative to the first connecting portion, and a distance between the second connecting portion and the first edge ranges from 2 mm to 20 mm.

2. The photovoltaic module according to claim 1, wherein the first connecting portion covers a part of the main body portion, and an orthographic projection of the first connecting portion on the main body portion has an overlapping area with the main body portion.

3. The photovoltaic module according to claim 2, wherein the overlapping area coincides with the orthographic projection of the first connecting portion on the main body portion.

4. The photovoltaic module according to claim 1, wherein one end of the first connecting portion closer to the first edge relative to the other end of the first connecting portion is connected to the second connecting portion.

5. The photovoltaic module according to claim 4, wherein in a direction perpendicular to the length direction of the main body portion, the main body portion has a first bending line and a second bending line, the first bending line is located at a junction of the main body portion and the first connecting portion, and the second bending line is located at a junction of the first connecting portion and the second connecting portion;

in a thickness direction of the main body portion, the first bending line is disposed directly opposite to the first edge, and the second bending line is disposed directly opposite to an edge of the first connecting portion facing away from the first edge.

6. The photovoltaic module according to claim 1, wherein in the length direction of the main body portion, the main body portion comprises a first main body portion and a second main body portion:

in a thickness direction of the main body portion, the first main body portion is disposed opposite to the first connecting portion, the first main body portion and the second main body portion together form the main body portion; and in the thickness direction of the main body portion, a thickness of the first main body portion is less than or equal to a thickness of the second main body portion.

7. The photovoltaic module according to claim 6, wherein the first main body portion is fixedly connected to the first connecting portion in a back-to-back manner.

8. The photovoltaic module according to claim 6, wherein in the thickness direction of the main body portion, a thickness of the first connecting portion is less than or equal to the thickness of the first main body portion, or the thickness of the first connecting portion is less than or equal to the thickness of the second body portion.

9. The photovoltaic module according to claim 1, wherein a length of the first connecting portion is less than or equal to a height of a part of the second connecting portion that extends out of the main body portion.

10. The photovoltaic module according to claim 9, wherein a ratio of the length of the first connecting portion to the height of the part of the second connecting portion that extends out of the main body portion ranges from 0.4 to 1.

11. The photovoltaic module according to claim 1, wherein the first connecting portion and the second connecting portion are integrally formed;

the first connecting portion and the second connecting portion are fixedly connected to the main body portion.

12. The photovoltaic module according to claim 6, wherein in a width direction of the main body portion, a width of the second main body portion is smaller than or equal to a width of the first main body portion.

13. The photovoltaic module according to claim 12, wherein on a cross section in the thickness direction of the main body portion, the first main body portion has a cross-sectional area of the same area as a cross-sectional area of the second main body portion.

14. The photovoltaic module according to claim 1, wherein each of the plurality of cell strings comprises a plurality of solar cell pieces connected in series, and a busbar is provided on the plurality of solar cell pieces;

the cell unit group comprises a first cell unit and a second cell unit disposed in sequence along a first direction;

the first direction is an extending direction of the busbar, and the extending direction of the busbar is perpendicular to the length direction of the main body portion; and the lead-out structure is disposed between the first cell unit and the second cell unit, and cell strings of the first cell unit and cell strings of the second cell unit are all connected to the main body, or the cell strings of the first cell unit and the cell strings of the second cell unit are all connected to the first connecting portion.

15. The photovoltaic module according to claim 14, wherein the connection structure further comprises second bus bars, the second bus bars are arranged in two groups, and the two groups of second bus bars are disposed at an upper edge and a lower edge of the first cell unit along the second direction, respectively.

16. The photovoltaic module according to claim 15, wherein the cell strings of the first cell unit are connected together by the second bus bar located on the upper edge of the first cell unit, and the cell strings of the second cell unit are connected together by the second bus bar located at the lower edge of the first cell unit.

17. The photovoltaic module according to claim 14, wherein a diode is further provided between the first cell unit and the second cell unit, and a positive electrode or a negative electrode of the diode is connected to the second connecting portion.

18. The photovoltaic module according to claim 14, wherein both of the first cell unit and the second cell unit are connected to the main body portion or the first connecting portion by a solder strip;

an extending direction of the solder strip intersects with the length direction of the main body portion; and an end of the solder strip that comes out of the cell unit group is connected to the main body portion, or the first connecting portion.

19. The photovoltaic module according to claim 1, further comprising:

a cover plate, configured to cover an upper surface of the plurality of cell strings;

a back plate, configured to cover a back surface of the plurality of cell strings;

a junction box, wherein a diode is disposed in the junction box, and the diode is connected to the second connecting portion, and an adhesive layer is provided between the plurality of cell strings and the cover plate and between the plurality of cell strings and the back plate.

20. The photovoltaic module according to claim 19, wherein the adhesive layer comprises a first adhesive layer and a second adhesive layer, the first adhesive layer is disposed between the cell string and the cover plate to fix of the cell string and the cover plate, and the second adhesive layer is disposed between the cell string and the back plate to fix the cell string and the back plate.

* * * * *